United States Patent
Doering

(10) Patent No.: US 11,684,941 B2
(45) Date of Patent: Jun. 27, 2023

(54) SHOWERHEAD WITH EMBEDDED NUT

(71) Applicant: Applied Materials, Inc., Santa Clara, CA (US)

(72) Inventor: Kenneth Brian Doering, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 235 days.

(21) Appl. No.: 17/098,606

(22) Filed: Nov. 16, 2020

(65) Prior Publication Data

US 2021/0146394 A1 May 20, 2021

Related U.S. Application Data

(60) Provisional application No. 62/936,495, filed on Nov. 16, 2019.

(51) Int. Cl.
*B05B 15/62* (2018.01)
*H01L 21/67* (2006.01)
*B05B 1/18* (2006.01)

(52) U.S. Cl.
CPC .............. *B05B 15/62* (2018.02); *B05B 1/18* (2013.01); *H01L 21/67017* (2013.01)

(58) Field of Classification Search
CPC .. B05B 1/267; B05B 1/14; B05B 1/26; B05B 1/1618; B05B 15/40; A62C 31/05; A62C 37/11
See application file for complete search history.

(56) References Cited

U.S. PATENT DOCUMENTS

| | | | |
|---|---|---|---|
| 8,771,418 B2* | 7/2014 | Je | C23C 16/45565 156/345.33 |
| 8,846,163 B2* | 9/2014 | Kao | C23C 14/50 134/4 |
| 2008/0087641 A1* | 4/2008 | De La Llera | H01J 37/32449 438/689 |
| 2008/0268173 A1 | 10/2008 | White et al. | |
| 2012/0027918 A1 | 2/2012 | Tiner et al. | |
| 2014/0209027 A1 | 7/2014 | Lubomirsky et al. | |
| 2014/0238608 A1 | 8/2014 | Sabri et al. | |

* cited by examiner

*Primary Examiner* — Qingzhang Zhou
*Assistant Examiner* — Joel Zhou
(74) *Attorney, Agent, or Firm* — Servilla Whitney LLC

(57) ABSTRACT

A showerhead with an embedded nut is disclosed. The showerhead comprises an embedded nut within a cavity. The nut may be engaged by a bolt through an opening in the cavity to support the showerhead. The apparatus allows for the support of the showerhead without the potential for metal contamination.

16 Claims, 7 Drawing Sheets

SHOWERHEAD WITH EMBEDDED NUT

CROSS-REFERENCE TO RELATED APPLICATIONS

This application claims priority to U.S. Provisional Application No. 62/936,495, filed Nov. 16, 2019, the entire disclosure of which is hereby incorporated by reference herein.

TECHNICAL FIELD

Embodiments of the present disclosure generally relate to a showerhead apparatus for a semiconductor processing chamber secured by an embedded nut. Some embodiments

BACKGROUND

The presence of exposed metal materials within a semiconductor processing environment can lead to metal contamination on the substrates being processed. Metal contamination can lead to undesired film impurities, electrical shorts and other device failures.

Clamping or supporting gas distribution showerheads in high temperature process chambers is commonly performed with clamps which may use metal screws. The metal screws are typically remote enough from the processing region to avoid metal contamination. The clamps, especially those made from quartz, are typically very fragile and break easily.

Another method for supporting a showerhead over a processing region uses alloyed screws, such as Hastelloy, outboard of the wafer. However, the alloys do not entirely eliminate all potential metal exposure.

Accordingly, there is a need for a robust apparatus to support a gas distribution showerhead without exposed metal.

SUMMARY

One or more embodiments of the disclosure are directed to a showerhead comprising a body having an inner region and an outer region. The inner region has a back surface and a front surface defining a thickness of the inner region. The outer region has a back surface and a front surface defining a thickness of the outer region. The body is bounded by an outer peripheral edge. A plurality of cavities is within the outer region of the body. Each of the cavities has a back surface with an opening extending to the back surface of the outer region. A cover plate is fused with the body. The cover plate has a back surface within the cavity and a front surface coplanar with the front surface of the outer region of the body. A nut is positioned within each of the cavities configured to receive a bolt through the opening in the back surface of the cavity.

Additional embodiments of the disclosure are directed to a gas distribution assembly comprising a showerhead as described above. A gas distribution funnel is positioned above the inner region of the showerhead. The gas distribution funnel shaped so as to form a funnel-shaped space above the inner region. A base ring overlaps the outer region of the showerhead. The base ring comprises a plurality of holes through the base ring. Each hole is aligned to an opening in the cavities. Each hole contains a bolt configured to attach to a nut through the opening.

Further embodiments of the disclosure are directed to a method of forming a showerhead. The method comprises providing a showerhead body having an inner region and an outer region. The inner region has a back surface and a front surface defining a thickness of the inner region. The outer region has a back surface and a front surface defining a thickness of the outer region. The showerhead body is bounded by an outer peripheral edge. A cavity is formed within an outer region of the showerhead body. The cavity has a back surface with an opening extending to the back surface of the outer region. A nut is placed within the cavity. The nut is configured to receive a bolt through the opening in the back surface of the cavity. A cover plate is fused to the front surface of the showerhead to close the cavity. The cover plate has a back surface within the cavity and a front surface substantially coplanar with the front surface of the outer region of the showerhead.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the disclosure advantageously provide showerheads comprising an embedded nut to secure the showerhead within a processing chamber without any exposed metal.

The showerhead of some embodiments comprises a body with a plurality of cavities. A nut is positioned within each of the cavities. A more complete description of the invention may be had by reference to the attached drawings.

Figure 1:
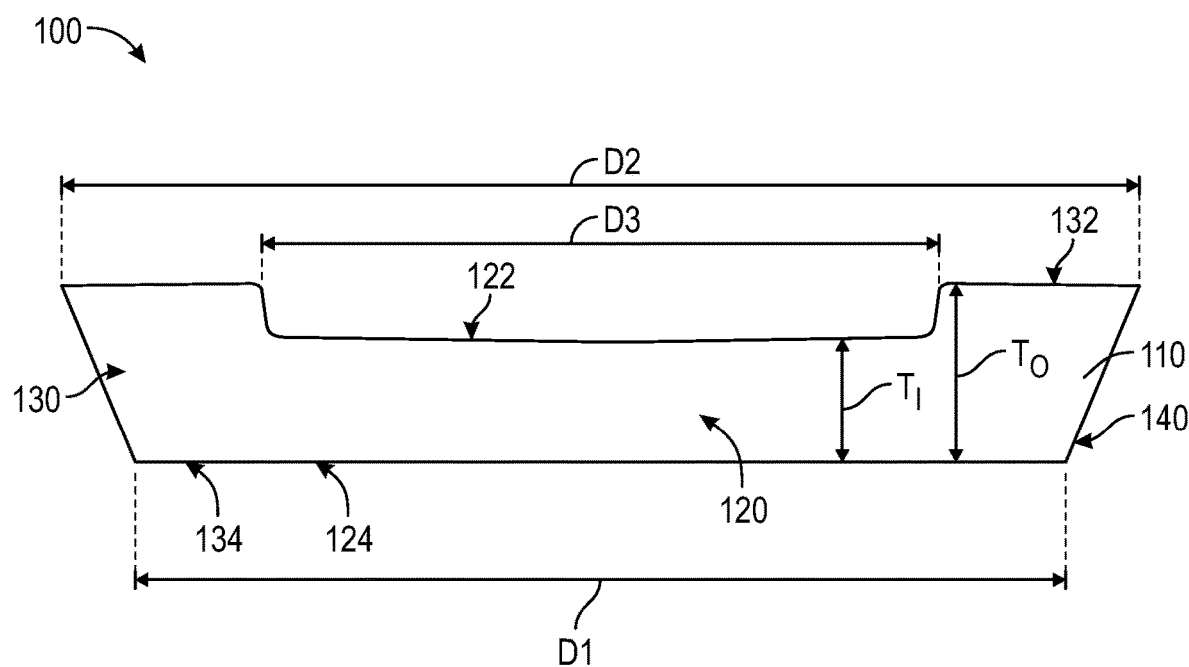
FIG. 1 illustrates a cross-sectional side view of a showerhead according to one or more embodiment of the disclosure.

Referring to FIG. 1, a showerhead 100 comprises a body 110. The body 110 may also be referred to as a showerhead body. The body 110 has an inner region 120 and an outer region 130. The inner region 120 has a back surface 122 and a front surface 124 defining a thickness $T_I$ of the inner region 120. The outer region 130 has a back surface 132 and a front surface 134 defining a thickness $T_O$ of the outer region 130. The body 110 is bounded by an outer peripheral edge 140. In some embodiments, the front surfaces 124, 134 face the processing region of a processing chamber. In some embodiments, the front surfaces 124, 134 face a substrate during processing.

The body 110 may be comprised of any suitable material. In some embodiments, the materials of the showerhead or gas distribution assembly are selected to minimize or eliminate exposed metal surfaces. Accordingly, in some embodiments, the body 110 comprises quartz.

While not shown in FIG. 1, in some embodiments, the thickness $T_I$ of the inner region 120 is the same as the thickness $T_O$ of the outer region 130. Further, while the front surface 124 of the inner region 120 and the front surface 134 of the outer region 130 are shown as being coplanar in FIG. 1, the back surface 122 and front surface 124 of the inner region 120 may be extended or recessed relative to the back surface 132 and the front surface 134 of the outer region, respectively.

As used in this regard, "coplanar" means that the surfaces are coplanar within less than or equal to ±0.5 mm. In some embodiments, the surfaces are coplanar within ±0.5 mm, ±0.4 mm, ±0.35 mm, ±0.30 mm, ±0.25 mm, ±0.20 mm, ±0.15 mm, ±0.10 mm or ±0.05 mm.

In some embodiments, the outer peripheral edge 140 has a smaller diameter D1 at the front surface 134 of the outer region 130 and a larger diameter D2 at the back surface 132 of the outer region 130. Accordingly, in some embodiments, the outer peripheral edge 140 is sloped.

In some embodiments, the showerhead 100 is sized such that a substrate may be processed underneath the inner region 120. Accordingly, in some embodiments, the diameter D3 of the inner region 120 is in the range of 300 mm to 450 mm.

For simplicity, neither a cavity nor an embedded nut is shown in FIG. 1. Further, gas channels for the distribution of a reactive gas through the showerhead are also omitted. For reference, gas channels 280 are shown in FIGS. 2, 3, 5 and 6.

Figure 2:
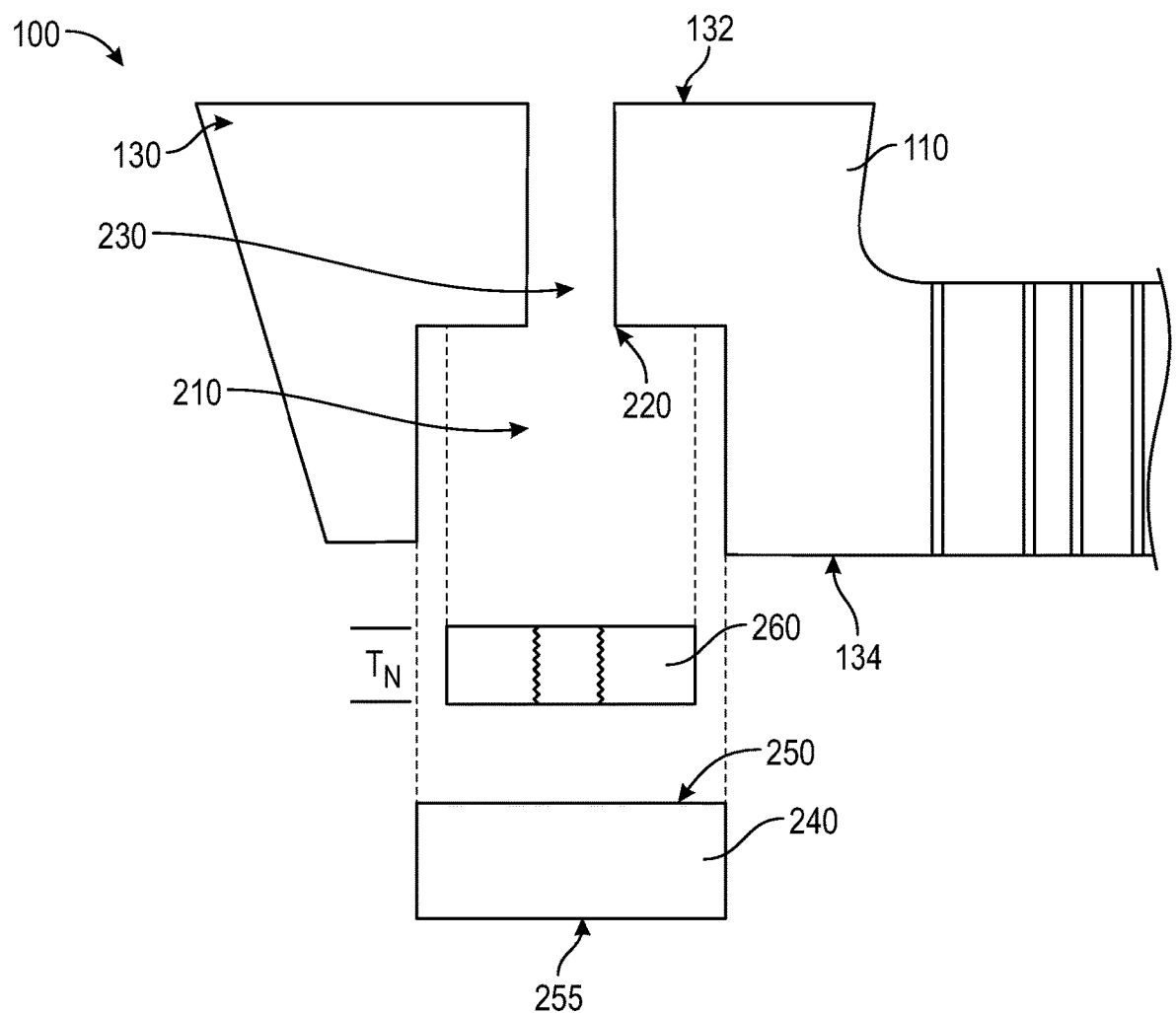
FIG. 2 shows an exploded side view of the outer region of a showerhead according to one or more embodiment of the disclosure.

FIG. 2 illustrates an exploded cross-sectional side view of a showerhead according to one or more embodiment of the disclosure. Referring to FIG. 2, the showerhead 100 comprises a plurality of cavities 210 within the outer region 130 of the body 110. Each cavity 210 has a back surface 220 with an opening 230 extending to the back surface 132 of the outer region 130. Each cavity 210 also has a cover plate 240 fused with the body 110. For ease of understanding, the cover plate is shown as separate from the body in FIG. 2. The finished orientation of the cover plate 240 and the body 110 can be seen in FIGS. 4-6.

Referring to FIGS. 2-6, the cover plate 240 has a back surface 250 within the cavity 210 and a front surface 255 coplanar with the front surface 134 of the outer region 130 of the body 110. In some embodiments, the cover plate 240 is fused or welded to the body 110. Without being bound by theory, it is believed that the cover plate 240, located on the wafer processing side of the showerhead 100, prevents the nut 260 and bolt 650, both typically comprising metal, from being exposed to any reactive gasses.

The cover plate 240 may be comprised of any suitable material. In some embodiments, the materials of the showerhead or gas distribution assembly are selected to minimize or eliminate exposed metal surfaces. Accordingly, in some embodiments, each cover plate 240 comprises quartz.

Figure 5:
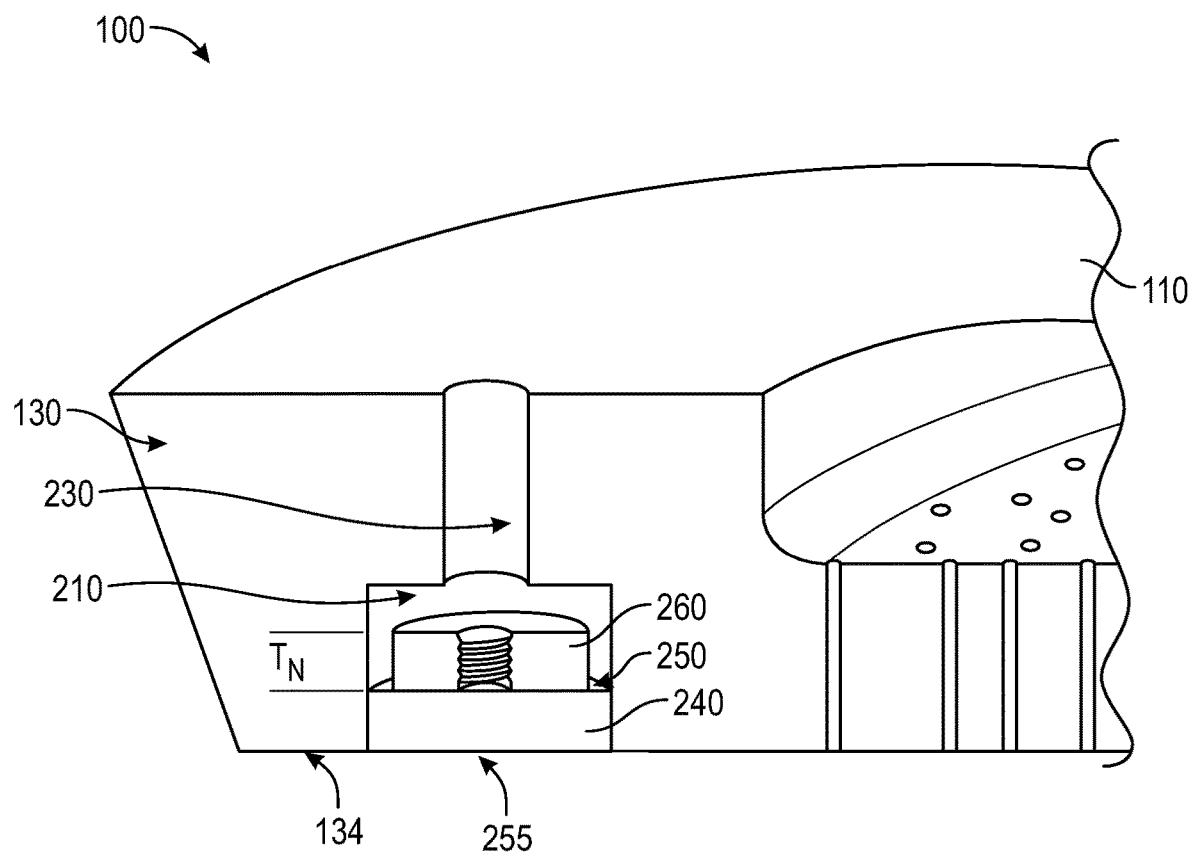
FIG. 5 illustrates a side perspective view of the outer region of a showerhead according to one or more embodiment of the disclosure.
Figure 6:
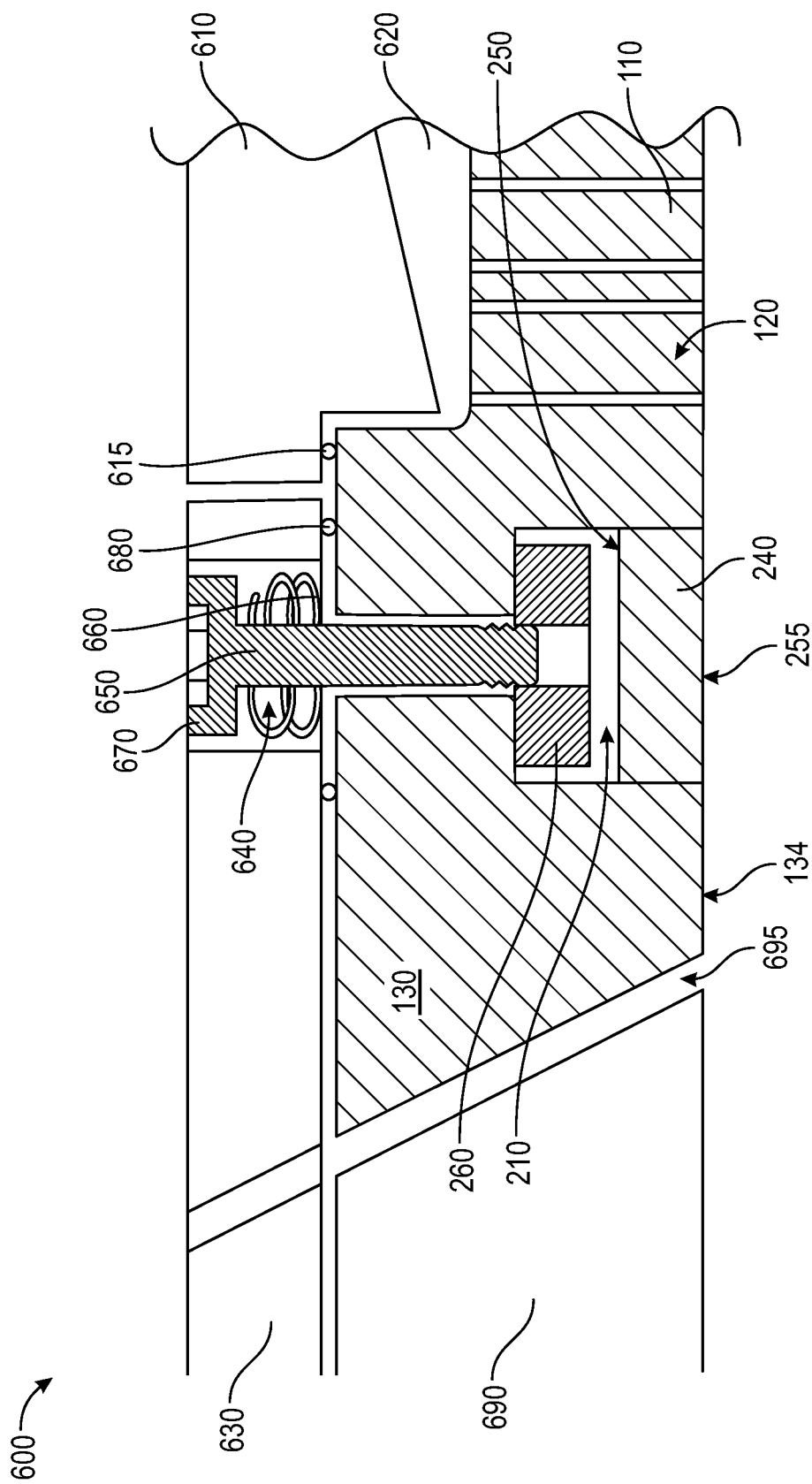
FIG. 6 shows a cross-sectional side view of a gas distribution assembly according to one or more embodiment of the disclosure.

Referring to FIGS. 2, 5 and 6, a nut 260 is positioned within each of the cavities 210. The nut 260 is configured to receive a bolt 650 through the opening 230 in the back surface 250 of the cavity 210. In this way, some embodiments of the disclosure provide a method of supporting the weight of the showerhead through the nut and bolt connection. In some embodiments, the showerhead 100 has a weight less than or equal to 10 lbs (4.5. kg).

In some embodiments, the nut 260 comprises a refractory metal. In some embodiments, the nut 260 comprises one or more of niobium, molybdenum, tantalum, tungsten, and rhenium. In some embodiments, the nut 260 comprises or consists essentially of ruthenium. In some embodiments, the nut 260 comprises or consists essentially of molybdenum. As used in this regard, a material consists essentially of an element when the material is comprised of greater than or equal to 95%, greater than or equal to 98%, greater than or equal to 99%, or greater than or equal to 99.5% of the stated element on an atomic basis.

In some embodiments, the nut 260 comprises a metal oxide. In some embodiments, the nut 260 comprises or consists essentially of aluminum oxide ($Al_2O_3$).

In some embodiments, the shape of the nut 260 is selected from one or more of oval, pill, rectangular or square shapes. In some embodiments, the each cavity 210 and each nut 260 are shaped to prevent rotation of the nut 260 within the cavity 210. For example, a pill shaped nut may be positioned within a cavity with a rectangular profile.

In some embodiments, the thickness $T_N$ of the nut is less than the thickness $T_C$ of the cavity 210. Stated differently, in some embodiments, the nut 260 is free to float within the cavity 210. Without being bound by theory, it is believed that a floating nut reduces or eliminates any thermal stress during use at high temperatures. In some embodiments, $T_N$ is in a range of 1 mm to 3 mm.

Figure 3:
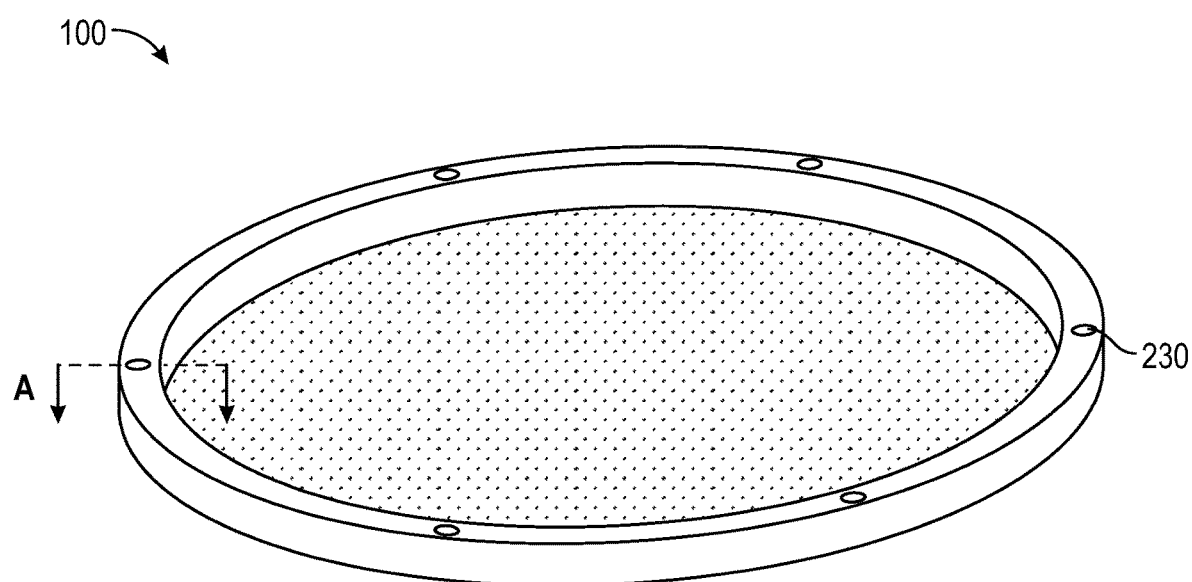
FIG. 3 illustrates a top perspective view of a showerhead according to one or more embodiment of the disclosure.
Figure 4:
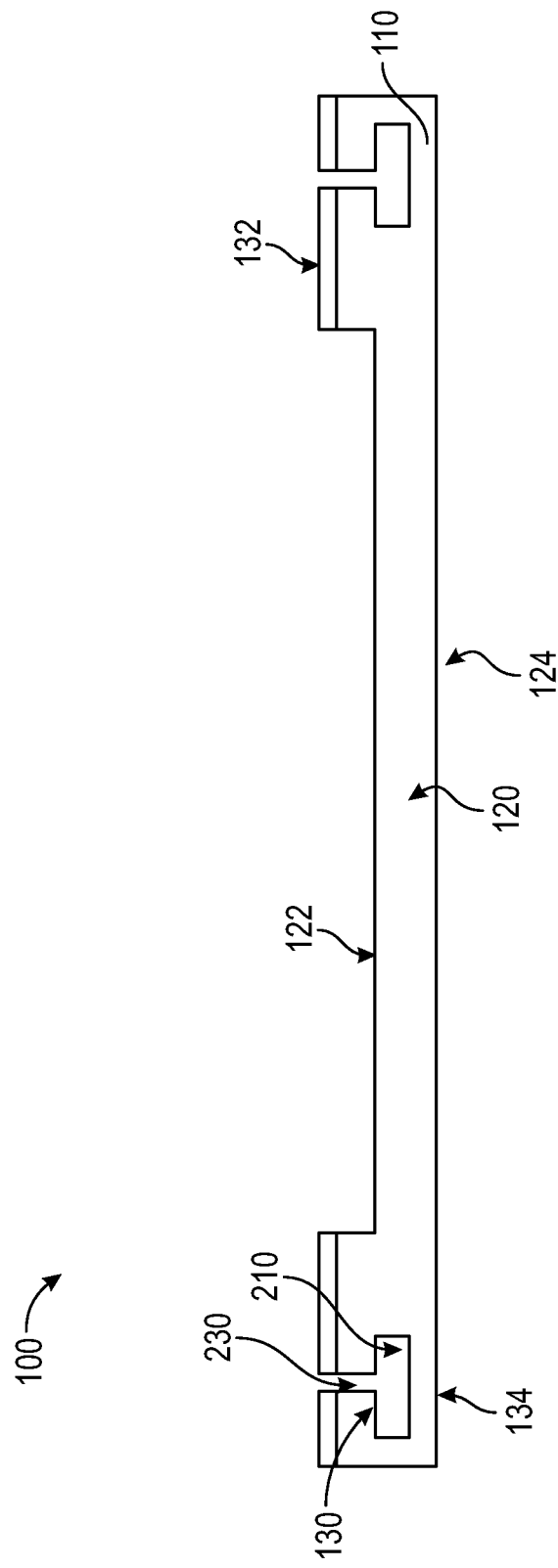
FIG. 4 illustrates a cross-sectional side view of the showerhead shown in FIG. 3 according to one or more embodiment of the disclosure.

Referring to FIGS. 3 and 4, a showerhead 100 is illustrated comprising six openings 230. Although not visible, the openings 230 of the showerhead 100 shown in FIG. 3, lead to six cavities 210. FIG. 4 shows a cross sectional view of the showerhead 100 of FIG. 3 along axis A. For simplicity, FIG. 4 does not show a nut 260 within each cavity 210. In some embodiments, the showerhead 100 comprises a plurality of cavities 210. In some embodiments, the number of cavities is greater than or equal to two, three, four, six, eight or twelve. In some embodiments, the showerhead comprises six cavities with nuts therein.

Additional embodiments of the present disclosure relate to gas distribution assemblies comprising a showerhead according to one or more embodiment of the disclosure.

Referring to FIG. 6, a gas distribution assembly 600 is illustrated. The gas distribution assembly 600 comprises a showerhead 100, a base ring 630 and a gas distribution funnel 610.

A gas distribution funnel 610 is positioned above the inner region 120 of the showerhead 100. The gas distribution funnel 610 is shaped so as to form a funnel-shaped space 620 above the inner region 120. In some embodiments, the gas distribution funnel 610 forms a fluid seal with the showerhead 100. The fluid seal may be facilitated by the placement of a seal 615 (e.g., an o-ring) between the gas distribution funnel 610 and the showerhead 100. In some embodiments, the seal 615 prevents contact between the gas distribution funnel 610 and the showerhead 100.

A base ring 630 overlaps the outer region 130 of the showerhead 100. The base ring 630 comprises a plurality of holes 640 through the base ring. Each hole 640 is aligned to an opening 230 in a cavity 210. Each hole 640 contains a bolt 650 configured to attach to a nut 260 through the opening 230. In some embodiments, the bolt 650 is a shoulder bolt. In some embodiments, the base ring 630 comprises aluminum. In some embodiments, the bolt 650 comprises aluminum.

In some embodiments, as shown, a spring 660 is around the bolt 650. In some embodiments, the spring 660 is positioned between the head 670 of the bolt 650 and the back surface 132 of the outer region 130. In some embodiments, the base ring comprises a protrusion within the hole 640. In some embodiments, the spring 660 is positioned between the protrusion and the head 670 of the bolt 650. Regardless of the arrangement, the spring 660 is configured to provide greater than or equal to 6.8 lbs of force. In some embodiments, the spring 660 is a double wave spring.

In some embodiments, the gas distribution assembly further comprises a seal 680 surrounding the bolt 650. The seal 680 is positioned between the showerhead 100 and the base ring 630. The seal 680 isolates the bolt 650 and the nut 260 from the processing environment. In some embodiments, the seal 680 may comprises a sealing washer or an o-ring. The seal 680 may prevent contact between the base ring 630 and the showerhead 100.

In some embodiments, the gas distribution assembly further comprises an outer ring 690 positioned around the outer peripheral edge 140 of the showerhead 100. The outer ring 690 and the showerhead 100 are spaced apart to allow a flow of gas between within a channel 695. In some embodiments, the showerhead 100 and the outer ring 690 are formed as a single part with channel 695 being a hole through the single part.

As shown in FIG. 6, the base ring 630 may contain a plurality of holes 635 to allow for a vacuum/purge channel through the base ring 630.

Figure 7:
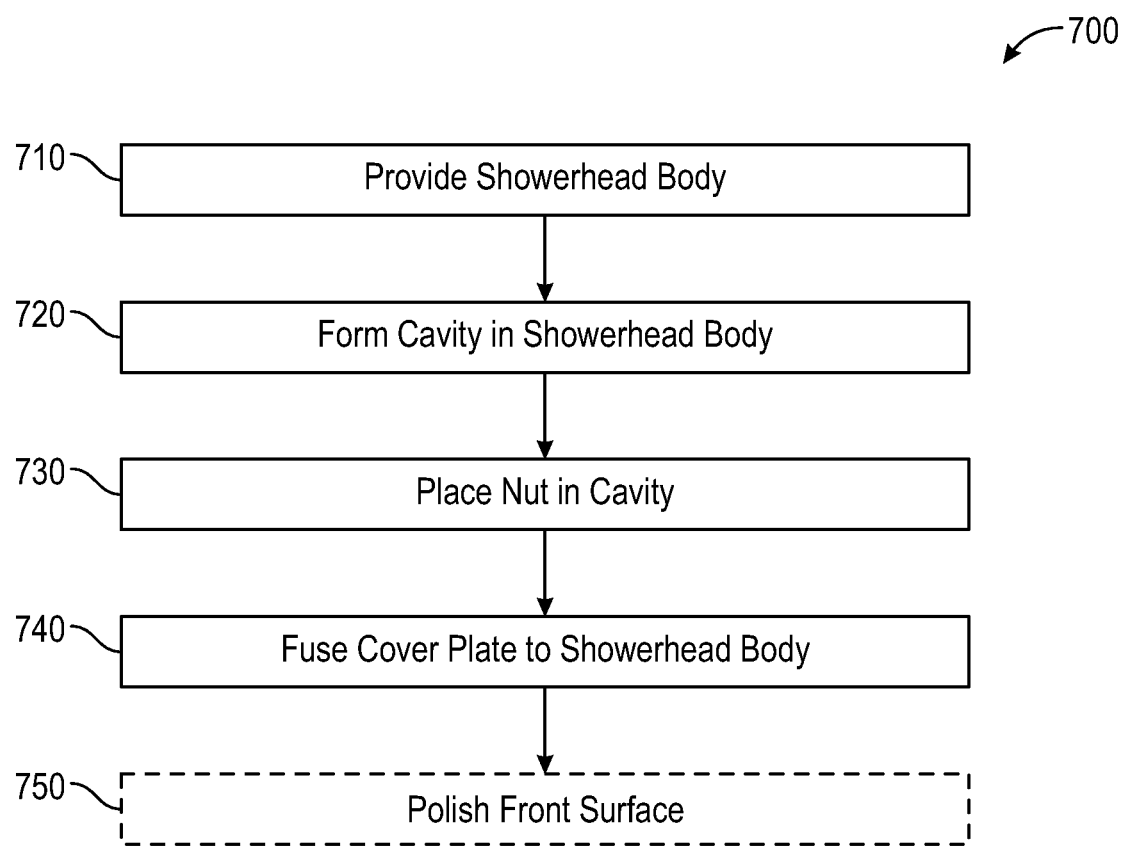
FIG. 7 shows a method of forming a showerhead according to one or more embodiment of the disclosure.

Further embodiments of the present disclosure relate to methods of manufacturing a showerhead according to one or more embodiment of the disclosure. FIG. 7 illustrates a flowchart of the method 700. The method 700 beings at 710 by providing a showerhead body. The showerhead body may be any suitable body. In some embodiments, the showerhead body is the body 110 described above.

The method 700 continues at 720 by forming a cavity within an outer region of the showerhead body. As described above, the cavity is formed to have a back surface with an opening extending to the back surface of the outer region.

At 730, a nut is placed within the cavity. As above, the nut is configured to receive a bolt through the opening in the back surface of the cavity.

After placing the nut, at 740, a cover plate is fused to the front surface of the showerhead to close the cavity. As above, the cover plate has a back surface within the cavity and a front surface coplanar with the front surface of the outer region of the showerhead. In some embodiments, the nut is free to float within the cavity. In some embodiments, fusing the cover plate comprises welding the cover plate at a temperature in a range of 1100° C. to 1200° C., or in a range of 1200° C. to 1300° C.

In some embodiments, at 750, the front face of the outer region of the showerhead body and the front surface of the cover plate are polished. In some embodiments, polishing comprises flame polishing. In some embodiments, polishing further comprises flattening the front surface of the face of the outer region of the showerhead body and the front surface of the cover plate. In some embodiments, after polishing, the face of the outer region of the showerhead body and the front surface of the cover plate are coplanar. In some embodiments, the face of the outer region of the showerhead body and the front surface of the cover plate are within +/–1-2 thousandths of an inch.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:
1. A showerhead comprising:
a body having an inner region and an outer region, the inner region having a back surface and a front surface defining a thickness of the inner region, the outer region having a back surface and a front surface defining a thickness of the outer region, the body bounded by an outer peripheral edge;

a plurality of cavities within the outer region of the body, each of the cavities having a back surface with an opening extending to the back surface of the outer region, and a cover plate fused with the body, the cover plate having a back surface within the cavity and a front surface coplanar with the front surface of the outer region of the body; and a nut positioned within and free to float within each of the cavities and configured to receive a bolt through the opening in the back surface of each cavity.

2. The showerhead of claim 1, wherein the nut comprises one or more of ruthenium or tantalum.

3. The showerhead of claim 1, wherein the nut comprises aluminum oxide.

4. The showerhead of claim 1, wherein each cavity and the nut positioned therein are shaped to prevent rotation of the nut within the cavity.

5. The showerhead of claim 4, wherein each cavity and the nut positioned therein are pill shaped.

6. The showerhead of claim 1, wherein the showerhead comprises six cavities.

7. The showerhead of claim 1, wherein the body comprises quartz.

8. The showerhead of claim 1, wherein the cover plate for each cavity comprises quartz.

9. The showerhead of claim 1, wherein the outer peripheral edge has a smaller diameter at the front surface than at the back surface of the outer region to form a sloped outer peripheral edge.

10. The showerhead of claim 9, wherein the front surface of the outer region has a diameter in a range of 300 mm to 450 mm.

11. The showerhead of claim 10, wherein the showerhead has a weight less than or equal to 10 lbs (4.5 kg).

12. A gas distribution assembly comprising:
a showerhead comprising:
a body having an inner region and an outer region, the inner region having a back surface and a front surface defining a thickness of the inner region, the outer region having a back surface and a front surface defining a thickness of the outer region, the body bounded by an outer peripheral edge;

a plurality of cavities within the outer region of the body, each of the cavities having a back surface with an opening extending to the back surface of the outer region, and a cover plate fused with the body, the cover plate having a back surface within the cavity and a front surface substantially coplanar with the front surface of the outer region of the body; and a nut positioned within and free to float within each of the cavities and configured to receive a bolt through the opening in the back surface of the cavity;

a gas distribution funnel positioned above the inner region of the showerhead, the gas distribution funnel shaped so as to form a funnel-shaped space above the inner region; and a base ring overlapping the outer region of the showerhead, the base ring comprising a plurality of holes through the base ring, each hole aligned to an opening in the cavities, each hole containing the bolt configured to attach to the nut through the opening.

13. The gas distribution assembly of claim 12, further comprising a spring around the bolt, the spring configured to provide a predetermined amount to force between the showerhead and the base ring.

14. The gas distribution assembly of claim 12, further comprising a seal surrounding the bolt and positioned between the showerhead and the base ring.

15. The gas distribution assembly of claim 12, further comprising an outer ring positioned around the outer peripheral edge of the showerhead, the outer ring and the showerhead spaced apart to allow a flow of gas between.

16. The gas distribution assembly of claim 12, wherein each cavity and the nut positioned therein are shaped to prevent rotation of the nut within the cavity.

* * * * *